(12) United States Patent
Huang et al.

(10) Patent No.: US 6,483,039 B2
(45) Date of Patent: Nov. 19, 2002

(54) SUBSTRATE OF SEMICONDUCTOR PACKAGE

(75) Inventors: Chien-Ping Huang, Hsinchu (TW);
Tzong-Da Ho, Taichung (TW);
Chen-Hsu Hsiao, Nantou (TW)

(73) Assignee: Siliconware Precision Industries, Co., Ltd. (TW)

( * ) Notice: Subject to any disclaimer, the term of this patent is extended or adjusted under 35 U.S.C. 154(b) by 0 days.

(21) Appl. No.: 09/946,902

(22) Filed: Sep. 5, 2001

(65) Prior Publication Data

US 2002/0112881 A1 Aug. 22, 2002

(30) Foreign Application Priority Data

Feb. 20, 2001 (TW) .......................................... 90103770

(51) Int. Cl.$^7$ ................................................. H05K 1/03
(52) U.S. Cl. ........................ 174/255; 174/261; 361/777; 361/779; 29/857
(58) Field of Search ............................... 174/255, 261; 361/777, 779; 29/825, 837, 842, 857, 847

(56) References Cited

U.S. PATENT DOCUMENTS

| | | | | |
|---|---|---|---|---|
| 4,528,259 A | * | 7/1985 | Sullivan | ...................... 430/312 |
| 4,902,610 A | * | 2/1990 | Shipley | ...................... 430/312 |
| 5,635,671 A | | 6/1997 | Freyman et al. | |
| 5,917,157 A | * | 6/1999 | Remsburg | ...................... 174/255 |

* cited by examiner

Primary Examiner—Albert W. Paladini
(74) Attorney, Agent, or Firm—Peter F. Corless; Steven M. Jensen; Edwards & Angell, LLP

(57) ABSTRACT

A substrate of a semiconductor package is proposed, which is formed with a strip copper layer on a core layer of the substrate, wherein a solder mask is arranged to cover the core layer and two lengthwise sides of the copper layer by a width between 0.1 mm to 1.0 mm, while a surface between the sides of the copper layer is exposed by forming a groove opening to the atmosphere and plated with gold. This makes bulges generated by shrinkage of the solder mask covering the sides of the copper layer extend outwardly in a direction away from the groove opening, allowing clamping force to be sufficiently exerted on the substrate by a mold during an encapsulation process. As such, after completing the encapsulation process, an encapsulating resin remained in the runner can be easily removed without damaging the substrate, and also resin flash can be prevented from occurrence.

14 Claims, 4 Drawing Sheets

SUBSTRATE OF SEMICONDUCTOR PACKAGE

FIELD OF THE INVENTION

The present invention relates to substrates of semiconductor packages, and more particularly, to a substrate which is used for supporting at least a semiconductor chip thereon and on which an encapsulant is formed to encapsulate the semiconductor chip.

BACKGROUND OF THE INVENTION

During an encapsulation process for a conventional BGA (ball grid array) semiconductor package, an encapsulating resin can be smoothly injected through a runner formed on a mold over a substrate into a cavity of the mold. However, after completing the encapsulation process, removable of the resin in the runner, which is securely adhered to a surface of the substrate corresponding in position to the runner, will usually accompany damage to the semiconductor package due to strong adhesion between the redundant resin and the surface of the substrate corresponding in position to the runner.

Therefore, in order to eliminate the undesirable damage to the semiconductor package, a novel design of the runner is disclosed in U.S. Pat. No. 5,635,671. The runner, as shown in FIGS. 1 and 2, has a long strip copper layer 13 mounted on a core layer 12 of a substrate 10 made of a BT resin, while solder mask 11 is applied to a surface of the core layer 12 in a manner that a groove opening 40 is formed on the copper layer 13 for exposing a surface 15 of the copper layer 13 to the groove opening 40. The exposed surface 15 of the copper layer 13 is then plated with gold to be corresponding in position to the runner during an encapsulation process. Since adhesion between an encapsulating resin and gold is ten times smaller than that between the resin and the substrate, the resin excessively remained over the exposed surface 15 of the copper layer 13 can be easily removed after completion of the encapsulation process. This then eliminates problems of damaging the substrate or the semiconductor package due to strong adhesion as previously recited.

However, as the application of the solder mask 11 usually accompanies a positioning off-set of around 0.075 mm, the copper layer 13 is deliberately formed to be wider than the opening 40 by an 0.075 mm width W at each of two lengthwise sides of the copper layer 13. This is to avoid possible exposure of the core layer 12 beneath the copper layer 13. As shown in the FIG. 2, with accurate positioning of the solder mask 11, the copper layer 13 will be covered by the solder mask 11 in a width of 0.075 mm at each lengthwise side of the copper layer 13.

Further, as the solder mask 11 above the lengthwise sides of the copper layer 13 may be partially bulged due to shrinkage of the solder mask 11 when subjected to heat, as shown in FIG. 2, a mold 60 used in the encapsulation process can only clamp the bulged part of the solder mask 11 which is of a narrow area of around 0.075 mm width, as shown in FIG. 3. This makes clamping force exerted on the substrate 10 by the mold 60 insufficient, and accordingly the encapsulating resin running through the runner 15 tends to leak out from the clamping area between the mold 60 and the bulged part of the solder mask 11, resulting in occurrence of flash indicated by arrow 16 and degradation of quality of products.

SUMMARY OF THE INVENTION

A primary objective of the present invention is to provide a substrate of a semiconductor package, in which an encapsulating resin remained in a runner and adhered to a substrate, after an encapsulation process is completed, can be easily removed without damaging the substrate or the semiconductor package itself, and flash of the resin can be prevented from occurrence.

According to the above and other objectives, a substrate of a semiconductor package is proposed in the present invention. The substrate has at least one strip copper layer formed on a core layer of the substrate, while a solder mask is applied to a surface of the core layer in a manner that a groove opening is formed on the copper layer for exposing a portion of the surface of the copper layer to the atmosphere. This exposed surface of the copper layer is then plated with gold. Moreover, the solder mask is arranged to cover two lengthwise sides of the copper layer by a width of between 0.1 mm and 1.0 mm, and most preferably 0.5 mm, so as to allow bulges of the solder mask over the copper layer generated from shrinkage of the solder mask to extend in a direction away from the groove opening, and to prevent resin flash from occurrence.

In another embodiment of the present invention, the two long sides of the copper layer covered by the solder mask are formed with a plurality of projections extending in a direction away from the exposed opening of the copper layer.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF THE PREFERRED EMBODIMENT

Figure 1:
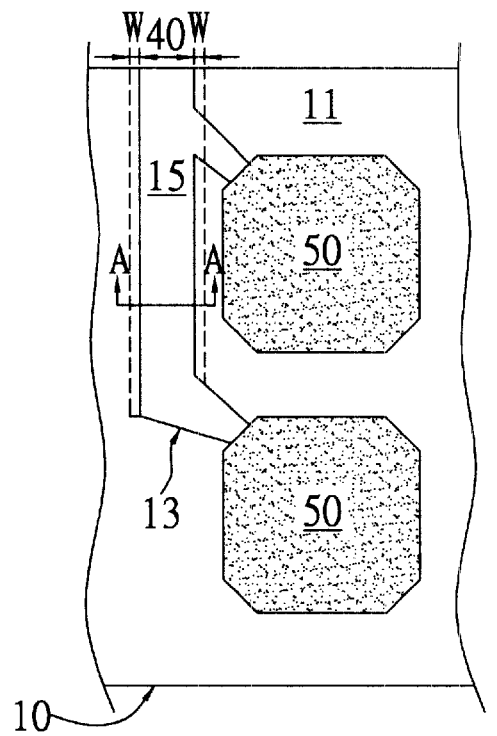
FIG. 1 (PRIOR ART) is a schematic diagram showing part of a conventional substrate.
Figure 2:
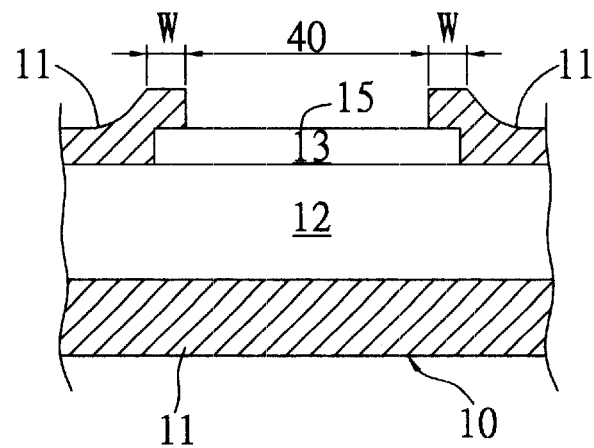
FIG. 2 (PRIOR ART) is a partial sectional view of FIG. 1 cutting along a line A—A.
Figure 3:
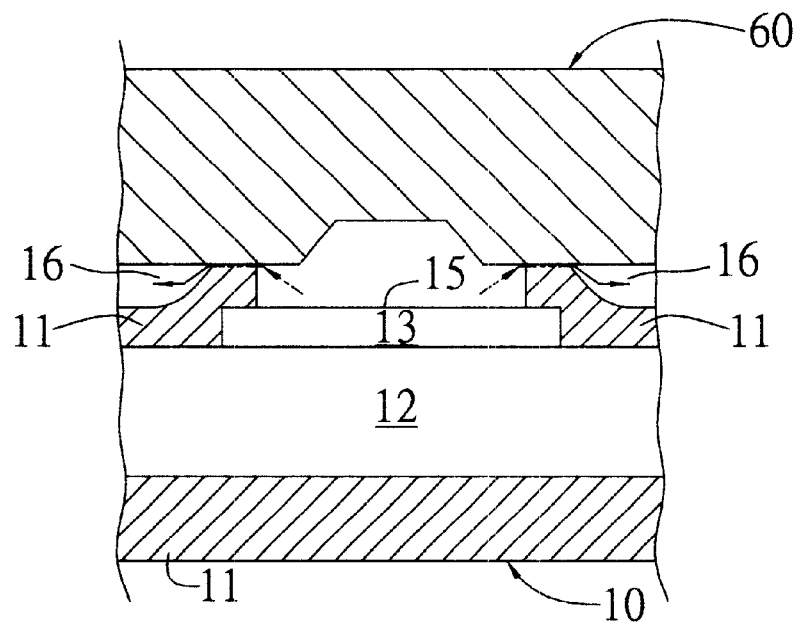
FIG. 3 (PRIOR ART) is a partial sectional view showing a conventional substrate of FIG. 2 clamped by molds.
Figure 4:
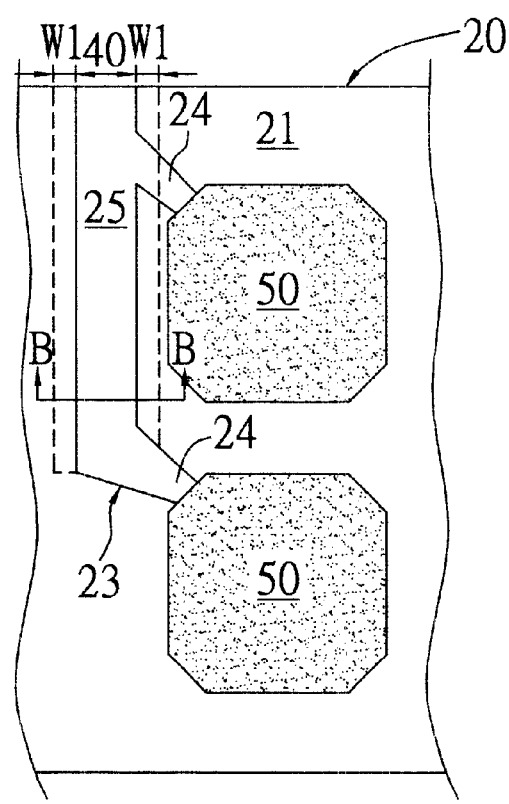
FIG. 4 is a partial schematic diagram of the substrate in the preferred embodiment of the invention.
Figure 5:
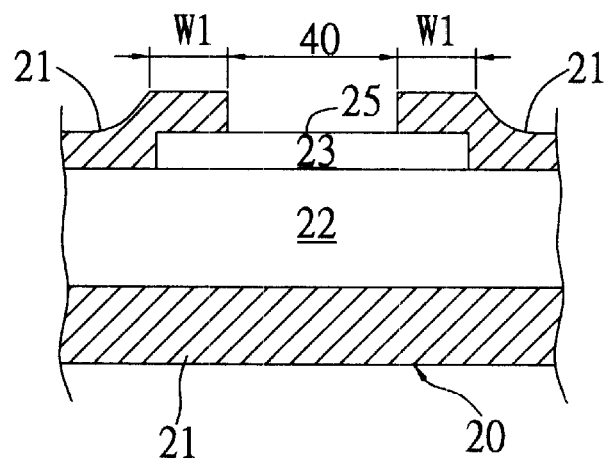
FIG. 5 is a partial sectional view of FIG. 4 cutting along a line B—B.

Illustrated in FIGS. 4 and 5 is a substrate 20 of the preferred embodiment of the present invention. The substrate 20 has at least one strip copper layer 23 formed on a core layer 22 of the substrate 20, while a solder mask 21 is applied on the core layer 22 and the copper layer 23 in a manner that a groove opening 40 is formed on the copper layer 23 for exposing a partial surface 25 of the copper layer 23. This exposed surface 25 of the copper layer 23 is then plated with gold to be used as a runner for encapsulation. Moreover, the copper layer 23 has two lengthwise sides thereof covered with the solder mask 21 by a width $W_1$ between 0.1 mm and 1.0 mm, and most preferably 0.5 mm; while the exposed surface 25 between the lengthwise sides is exposed by the groove opening 40 to the atmosphere.

Figure 6:
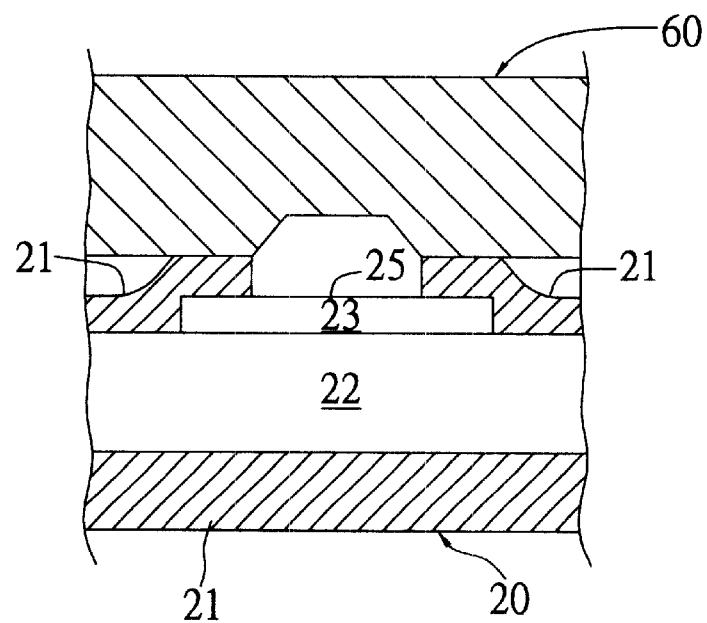
FIG. 6 is a partial sectional view showing the substrate of FIG. 5 clamped by molds in the preferred embodiment of the invention.

Thus, bulges of the solder mask 21 at the sides of the copper layer 23 generated from shrinkage of the solder mask 21 can extend in a direction away from the groove opening 40, which makes an area clamped by a mold 60 enlarged for providing sufficient clamping force, as shown in FIG. 6.

Therefore, during an encapsulation process, an encapsulating resin flows along the groove opening 40 through the runner 25 formed from the exposed surface of the copper layer 23 and then through a mold gate 24 to mold cavity 50. Since sufficient clamping force is provided by the mold 60 as mentioned above, the encapsulating resin flowing through the runner 25 can be prevented from leaking out through the clamping area between the mold 60 and bulges of the solder mask 21, and thus resin flash can be prevented from occurrence. Moreover, as the runner 25 of the copper layer 23 is plated with gold, with relatively weaker adhesion between the encapsulating resin and gold, the resin remained in the runner 25 can be easily removed after completing the encapsulation process, and thus the substrate 20 or other structures can be remained intact without being damaged.

Figure 7:
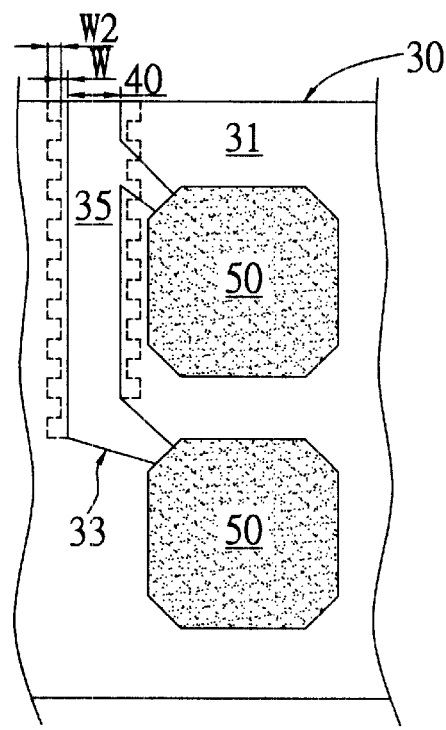
FIG. 7 is another partial schematic diagram of the substrate in another preferred embodiment of the invention.
Figure 8:
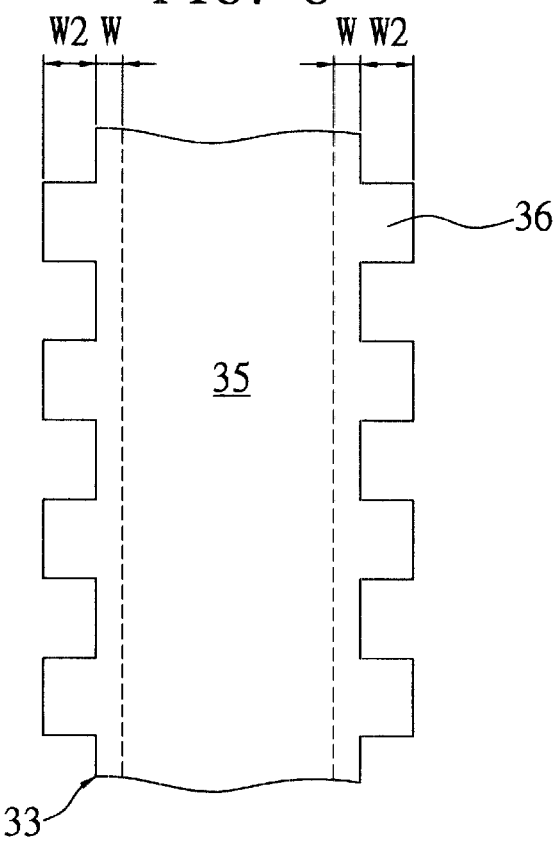
FIG. 8 shows a partial perspective view of the copper layer in another embodiment of the invention.

Illustrated in FIGS. 7 and 8 is a substrate 30 of another embodiment of the invention. The substrate 30 differs from the substrate 20 depicted in the above embodiment only in that two lengthwise sides of a copper layer 33 covered by a solder mask 31 are formed with a plurality of projections 36 extending in a direction away from an exposed surface 35 of the copper layer 33. In order to avoid an positioning off-set during applying the solder mask 31, the projections 36 extend outwardly for a length $W_2$ smaller than the width $W_1$ in the above embodiment by 0.075 mm, that is, the correlation among the extending length $W_2$, the width $W_1$ and a width W for the positioning off-set can be illustrated as follows.

$$W_2 = W_1 - W$$

As a result, with the use of the projections 36 in the condition of no positioning off-set occurring during applying the solder mask 31, enlargement in budged area of the solder mask 31 can also be achieved for providing sufficient clamping force so as to prevent resin flash from occurrence. Furthermore, the projections 36 can also improve the bonding strength between the solder mask 31 and the copper layer 33.

The invention has been described using exemplary preferred embodiments. However, it is to be understood that the scope of the invention is not limited to the disclosed embodiments. On the contrary, it is intended to cover various modifications and similar arrangements, for example, the outwardly extending protrusions 36 can be alternatively formed in a saw-like or ripple-like shape. The scope of the claims, therefore, should be accorded the broadest interpretation so as to encompass all such modifications and similar arrangements.

What is claimed is:

1. A substrate of a semiconductor package, comprising:
a core layer;
at least one strip copper layer formed on the core layer; and
a solder mask for covering the core layer and for respectively covering two lengthwise sides of the copper layer in a manner as to expose a portion of the copper layer between the two lengthwise sides;
wherein the solder mask covering the two lengthwise sides of the copper layer forms a strip of solder mask along each of the two lengthwise sides, and the strip of solder mask is of a width between 0.1 mm and 1.0 mm.

2. The substrate of claim 1, wherein the width of the strip of solder mask is 0.5 mm.

3. The substrate of claim 2, wherein the core layer is made of a BT resin.

4. The substrate of claim 1, wherein the core layer is made of a BT resin.

5. The substrate of claim 1, wherein the exposed portion of the copper layer is plated with gold.

6. A substrate of a semiconductor package, comprising:
core layer;
at least one strip copper layer formed on the core layer, wherein two lengthwise sides of the copper layer are each formed with a row of a plurality of projections extending outwardly with respect to the copper layer; and
a solder mask for covering the core layer and for respectively covering two lengthwise sides including the projections of the copper layer in a manner as to expose a portion of the copper layer between the two lengthwise sides;
wherein the solder mask covering the two lengthwise sides including the projections of the copper layer forms a strip of solder mask along each of the two lengthwise sides, and the strip of solder mask is of a width between 0.1 mm and 1.0 mm.

7. The substrate of claim 6, wherein the width of the strip of solder mask is 0.5 mm.

8. The substrate of claim 7, wherein each row of the projections is smaller in width than the strip of solder mask by 0.075 mm.

9. The substrate of claim 6, wherein each row of the projections is smaller in width than the strip of solder mask by 0.075 mm.

10. The substrate of claim 6, wherein the core layer is made of a BT resin.

11. The substrate of claim 6, wherein the projections are a plurality of projecting tongues.

12. The substrate of claim 6, wherein the projections are of a saw-like shape.

13. The substrate of claim 6, wherein the projections are of a ripple-like shape.

14. The substrate of claim 6, wherein the exposed portion of the copper layer is plated with gold.

* * * * *